US009986642B2

(12) United States Patent
Kunieda et al.

(10) Patent No.: US 9,986,642 B2
(45) Date of Patent: May 29, 2018

(54) METHOD FOR MANUFACTURING PRINTED WIRING BOARD AND PRINTED WIRING BOARD

(71) Applicant: IBIDEN CO., LTD., Ogaki (JP)

(72) Inventors: Masatoshi Kunieda, Ogaki (JP); Takafumi Okumura, Ogaki (JP)

(73) Assignee: IBIDEN CO., LTD., Ogaki (JP)

(*) Notice: Subject to any disclaimer, the term of this patent is extended or adjusted under 35 U.S.C. 154(b) by 0 days. days.

(21) Appl. No.: 15/216,735

(22) Filed: Jul. 22, 2016

(65) Prior Publication Data
US 2017/0027057 A1    Jan. 26, 2017

(30) Foreign Application Priority Data
Jul. 22, 2015 (JP) ................. 2015-144607

(51) Int. Cl.
H05K 1/11     (2006.01)
H05K 3/18     (2006.01)
H05K 3/42     (2006.01)
H01L 23/00    (2006.01)
H01L 23/31    (2006.01)

(52) U.S. Cl.
CPC .......... *H05K 1/115* (2013.01); *H01L 23/3114* (2013.01); *H01L 24/14* (2013.01); *H05K 3/185* (2013.01); *H05K 3/422* (2013.01); *H01L 2224/0239* (2013.01); *H01L 2224/02377* (2013.01); *H01L 2224/02379* (2013.01); *H01L 2224/04105* (2013.01); *H01L 2224/12105* (2013.01); *H01L 2224/13024* (2013.01); *H01L 2924/0105* (2013.01); *H01L 2924/01027* (2013.01); *H01L 2924/01028* (2013.01); *H01L 2924/01029* (2013.01); *H01L 2924/01046* (2013.01); *H01L 2924/01047* (2013.01); *H01L 2924/01079* (2013.01); *H05K 3/424* (2013.01); *H05K 2201/09545* (2013.01);
(Continued)

(58) Field of Classification Search
CPC .. H05K 1/00; H05K 1/02; H05K 1/03; H05K 1/11; H05K 1/44; H05K 1/115; H05K 3/00; H05K 3/02; H05K 3/04; H05K 3/18; H05K 3/24; H05K 3/42; H05K 3/46
USPC .... 174/257, 250, 251, 258, 262; 216/13, 18, 216/38; 427/123, 554, 596; 428/680; 430/312, 313, 315; 438/98, 687
See application file for complete search history.

(56) References Cited

U.S. PATENT DOCUMENTS 3,661,581 A * 5/1972 Feldstein ................ H01J 9/144
                                                    430/23
5,091,339 A * 2/1992 Carey ............... H01L 21/31144
                                                    216/18
(Continued)

FOREIGN PATENT DOCUMENTS

JP      2001-133974 A      5/2001

*Primary Examiner* — Xiaoliang Chen
(74) *Attorney, Agent, or Firm* — Oblon, McClelland, Maier & Neustadt, L.L.P.

(57) ABSTRACT

A method for manufacturing a printed wiring board includes forming, on a surface of an insulating layer, a patterned catalyst film including a catalyst for electroless plating such that the patterned catalyst film has a pattern corresponding to a conductor circuit, and applying electroless plating on the patterned catalyst film such that a conductor metal is deposited on the patterned catalyst film and that the conductor circuit is formed on the surface of the insulating layer.

20 Claims, 10 Drawing Sheets

(52) U.S. Cl.
CPC .............. *H05K 2201/09627* (2013.01); *H05K 2201/09645* (2013.01); *H05K 2203/0723* (2013.01)

(56) References Cited

U.S. PATENT DOCUMENTS

| | | | | |
|---|---|---|---|---|
| 5,173,442 A * | 12/1992 | Carey | ............... | H01L 21/31144 216/18 |
| 5,209,817 A * | 5/1993 | Ahmad | ............. | H01L 23/49827 205/125 |
| 5,219,787 A * | 6/1993 | Carey | ............... | H01L 21/31144 257/E21.257 |
| 5,679,268 A * | 10/1997 | Takahashi | ............ | H05K 1/0293 216/13 |
| 5,764,119 A * | 6/1998 | Miyagi | ................... | H01P 3/088 174/250 |
| 5,891,606 A * | 4/1999 | Brown | ................... | H05K 1/115 216/18 |
| 6,127,052 A * | 10/2000 | Tomari | ................... | H05K 3/181 205/126 |
| 6,153,521 A * | 11/2000 | Cheung | ............. | H01L 21/76843 257/E21.586 |
| 6,255,037 B1 * | 7/2001 | Kanoh | ................... | H01G 4/308 427/301 |
| 6,802,985 B1 * | 10/2004 | Chikama | ................... | C23C 2/02 205/166 |
| 9,664,633 B2 * | 5/2017 | Erdler | ..................... | G01N 27/12 |
| 2001/0012869 A1 * | 8/2001 | Fukushima | .......... | C09D 183/16 524/588 |
| 2008/0098597 A1 * | 5/2008 | Jung | .................... | H05K 3/0058 29/846 |
| 2008/0251495 A1 * | 10/2008 | Cheng | .................... | H05K 3/421 216/13 |
| 2008/0264676 A1 * | 10/2008 | Okabe | .................. | H05K 1/0265 174/250 |
| 2008/0283275 A1 * | 11/2008 | Banach | .................. | C23C 18/30 174/250 |
| 2009/0239331 A1 * | 9/2009 | Xu | ................... | H01L 31/022425 438/98 |
| 2009/0260868 A1 * | 10/2009 | Oh | ........................ | H05K 3/4647 174/262 |
| 2010/0124619 A1 * | 5/2010 | Xu | ........................ | C23C 18/161 427/554 |
| 2015/0053457 A1 * | 2/2015 | Kim | ..................... | H05K 3/1258 174/251 |
| 2015/0053469 A1 * | 2/2015 | Kim | ..................... | H05K 1/0306 174/258 |

\* cited by examiner

METHOD FOR MANUFACTURING PRINTED WIRING BOARD AND PRINTED WIRING BOARD

CROSS-REFERENCE TO RELATED APPLICATIONS

The present application is based upon and claims the benefit of priority to Japanese Patent Application No. 2015-144607, filed Jul. 22, 2015, the entire contents of which are incorporated herein by reference.

BACKGROUND OF THE INVENTION

Field of the Invention

The present invention relates to a method for manufacturing a printed wiring board based on a wiring process of a full-additive method and relates to a printed wiring board manufactured using the method.

Description of Background Art

Japanese Patent Laid-Open Publication No. 2001-133974 describes a full-additive method in which in which a catalyst nucleus is added on an insulating interlayer resin layer of which a surface has been subjected to a roughening treatment, a photosensitive resin layer is provided on the catalyst nucleus, the photosensitive resin layer is subjected to mask exposure and development processing and a patterned plating resist is formed, and a conductor circuit is provided on the insulating interlayer resin layer by forming a copper plating layer by electroless plating in a portion where the plating resist is not formed. The entire contents of this publication are incorporated herein by reference.

SUMMARY OF THE INVENTION

According to one aspect of the present invention, a method for manufacturing a printed wiring board includes forming, on a surface of an insulating layer, a patterned catalyst film including a catalyst for electroless plating such that the patterned catalyst film has a pattern corresponding to a conductor circuit, and applying electroless plating on the patterned catalyst film such that a conductor metal is deposited on the patterned catalyst film and that the conductor circuit is formed on the surface of the insulating layer.

According to another aspect of the present invention, a printed wiring board includes an insulating layer, and a conductor circuit formed on a surface of the insulating layer and including a patterned catalyst film formed on the surface of the insulating layer and a conductor metal deposited on the patterned catalyst film. The patterned catalyst film has a pattern corresponding to the conductor circuit and includes a catalyst for electroless plating, and the conductor metal includes an electroless plating metal deposited on the patterned catalyst film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
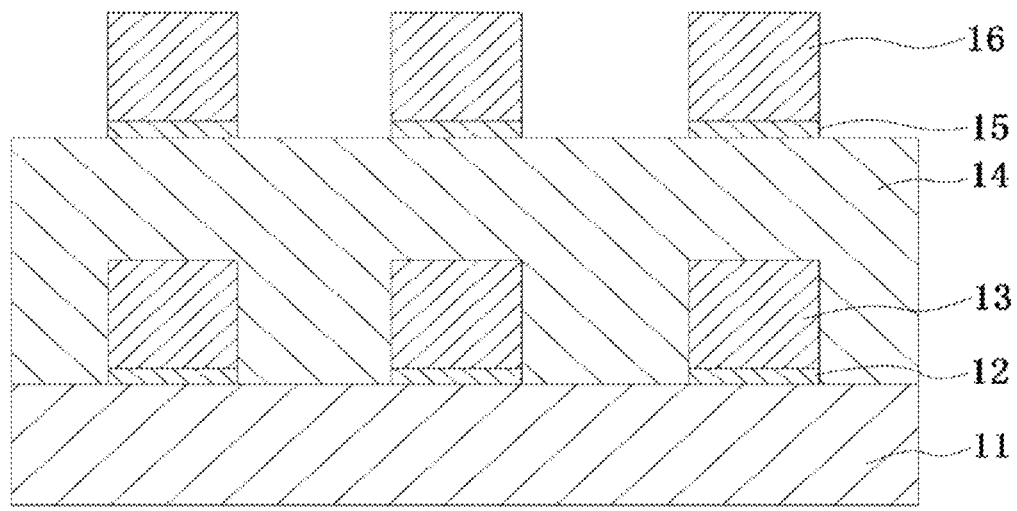
FIG. 1 is a cross-sectional view that schematically illustrates a printed wiring board manufactured using a method for manufacturing a printed wiring board of an embodiment of the present invention.

The embodiments will now be described with reference to the accompanying drawings, wherein like reference numerals designate corresponding or identical elements throughout the various drawings.

Figure 2:
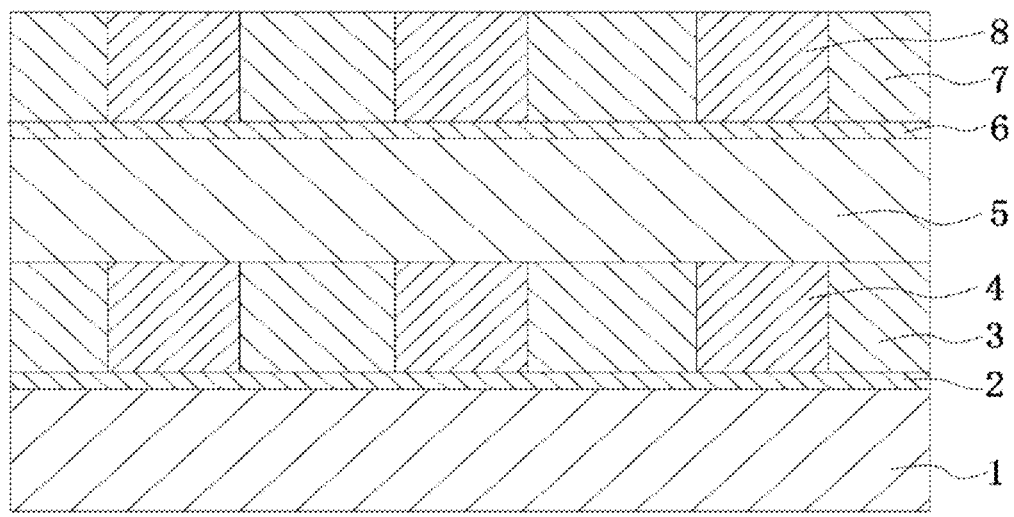
FIG. 2 is a cross-sectional view that schematically illustrates a printed wiring board manufactured using a method, based on a conventional full-additive method, for manufacturing a printed wiring board.

In the following, multiple embodiments of a method, based on a full-additive method, for manufacturing a printed wiring board according to an embodiment of the present invention are described in detail. FIG. 1 is a cross-sectional view that schematically illustrates a printed wiring board manufactured using a method for manufacturing a printed wiring board of an embodiment of the present invention. Further, FIG. 2 is a cross-sectional view that schematically illustrates a printed wiring board manufactured using a method, based on a conventional full-additive method, for manufacturing a printed wiring board.

The printed wiring board illustrated in FIG. 1 includes: a lower-layer insulating resin layer 11 as an insulating layer; a lower-layer patterned catalyst film 12 that is formed on the lower-layer insulating resin layer 11; and a lower-layer conductor circuit 13 that is formed of an electroless plating metal deposited on the lower-layer patterned catalyst film 12, and also includes: an upper-layer insulating resin substrate 14 as another insulating layer that is laminated and formed so as to cover the lower-layer insulating resin layer 11 and the lower-layer conductor circuit 13; an upper-layer patterned catalyst film 15 that is formed on the upper-layer insulating resin substrate 14; and an upper-layer conductor circuit 16 that is formed of an electroless plating metal deposited on the upper-layer patterned catalyst film 15.

Figure 3A:
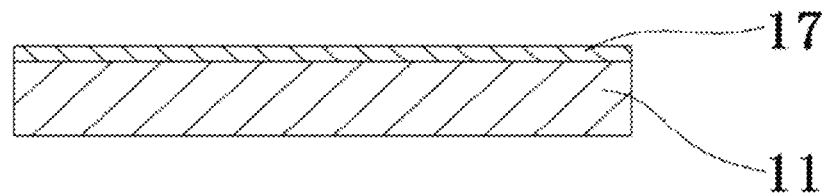
FIG. 3A-3D are explanatory diagrams illustrating the method for manufacturing a printed wiring board of the embodiment.

FIG. 3A-3D are explanatory diagrams illustrating the method for manufacturing a printed wiring board of the embodiment. In the method for manufacturing a printed wiring board of the embodiment, when the printed wiring board illustrated in FIG. 1 is manufactured, first, as illustrated in FIG. 3A, the lower-layer insulating resin layer 11 as an insulating layer is prepared. A liquid photosensitive catalyst is applied on an upper side surface of the lower-layer insulating resin layer 11, and a thin photosensitive catalyst film 17 having a thickness of, for example, about 0.02 μm-0.5 μm is formed. The lower-layer insulating resin layer 11 and the lower-layer conductor circuit 13 can be used as an insulating interlayer resin layer and an interlayer conductor layer of a multilayer printed wiring board.

As a material of the lower-layer insulating resin layer 11, for example, polyimide, epoxy, acrylic, PET, and the like can be used. The lower-layer insulating resin layer 11 may be formed by applying a liquid resin material on a base (not illustrated in the drawings) or on a further-lower-layer insulating layer or a core substrate or the like, and curing the resin material by heating or the like. Or, the lower-layer insulating resin layer 11 may also be formed using a resin film. The lower-layer insulating resin layer 11 may contain a reinforcing material such as a glass cloth. As insulating layers, in addition to the resin layers, a glass substrate or the like can also be used. Further, as a material of the photosensitive catalyst film 17, for example, "HYPERTECH (registered trademark) PL-series photosensitive electroless plating nucleating agent" manufactured by Nissan Chemical Industries, Ltd. can be used.

Figure 3B:
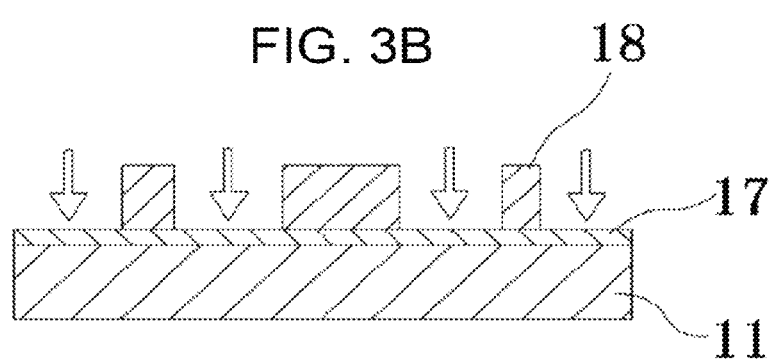
Figure 3C:
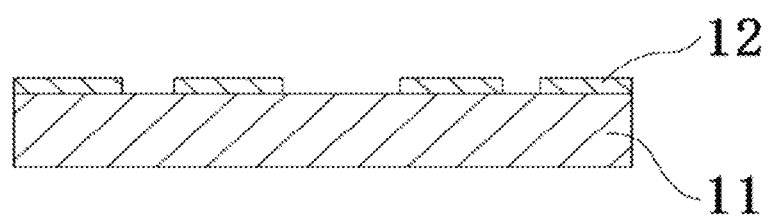

Next, as illustrated in FIG. 3B, a mask 18 that is patterned corresponding to the lower-layer conductor circuit 13 is positioned on the photosensitive catalyst film 17. Via the mask 18, the photosensitive catalyst film 17 is exposed, for example, with ultraviolet light as indicated by arrows in FIG. 3B, and an exposed portion of the photosensitive catalyst film 17 is cured. Next, as illustrated in FIG. 3C, after the mask 18 is removed, an uncured portion of the photosensitive catalyst film 17 is removed using a liquid developer, and the patterned catalyst film 12 that is patterned corresponding to the lower-layer conductor circuit 13 is formed. The patterned catalyst film 12 may also be formed by printing a catalyst in a pattern, for example, using an inkjet of an inkjet printer, instead of the pattern exposure and development processing of the photosensitive catalyst film 17.

Figure 3D:
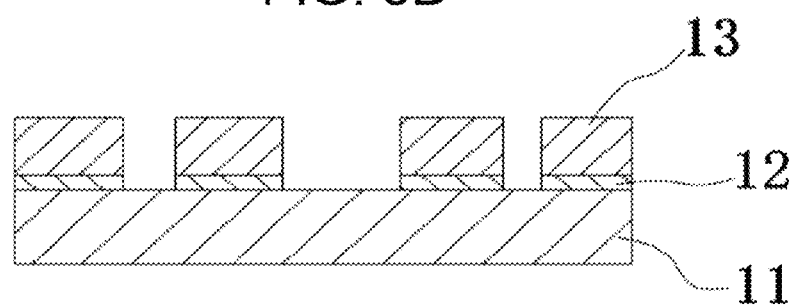

Thereafter, as illustrated in FIG. 3D, for example, copper as a conductor metal is deposited on the patterned catalyst film 12 by electroless plating, and the lower-layer conductor circuit 13 is formed by the copper. Then, the upper-layer insulating resin layer 14 is formed, for example, by laminating a resin film on the lower-layer insulating resin layer 11 and the lower-layer conductor circuit 13 and applying pressure and heat to the resin film. Thereafter, by the same processes as described above, the upper-layer patterned catalyst film 15 and the upper-layer conductor circuit 16 are formed. As a result, the printed wiring board illustrated in FIG. 1 is manufactured. The upper-layer insulating resin layer 14 and the upper-layer conductor circuit 16 also can be used as an insulating interlayer resin layer and an interlayer conductor layer of a multilayer printed wiring board.

Figure 4A:
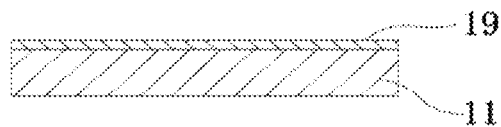
FIG. 4A-4G are explanatory diagrams illustrating a method, based on a semi-additive method, for manufacturing a printed wiring board.
Figure 4B:
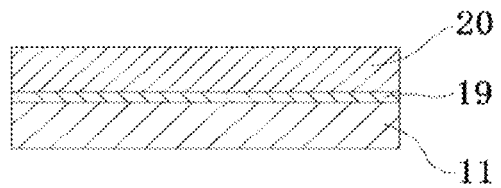

FIG. 4A-4G are explanatory diagrams illustrating a method, based on a semi-additive method, for manufacturing the same printed wiring board as illustrated in FIG. 1. In this case, first, as illustrated in FIG. 4A, the lower-layer insulating resin layer 11 as an insulating layer is prepared. A catalyst nucleus (not illustrated in the drawings) is added on a surface of the lower-layer insulating resin layer 11. Due to the catalyst nucleus, for example, an electroless copper plating layer 19 as a seed layer is formed on the surface of the lower-layer insulating resin layer 11 by an electroless plating treatment. Next, as illustrated in FIG. 4B, a photosensitive plating resist layer 20 is formed on the electroless copper plating layer 19.

Figure 4C:
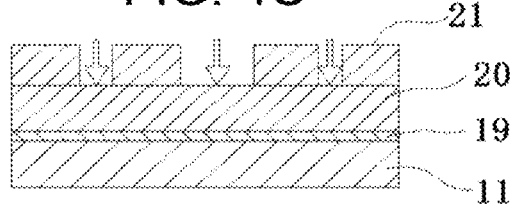
Figure 4D:

Next, as illustrated in FIG. 4C, a mask 21 that is patterned corresponding to the lower-layer conductor circuit 13 is positioned on the photosensitive plating resist layer 20. Via the mask 21, the photosensitive plating resist layer 20 is exposed, for example, with ultraviolet light as indicated by arrows in FIG. 4C, and an exposed portion of the photosensitive plating resist layer 20 is cured. Next, as illustrated in FIG. 4D, after the mask 21 is removed, an uncured portion of the photosensitive plating resist layer 20 is removed using a liquid developer, and a patterned plating resist layer 22 that is patterned corresponding to the lower-layer conductor circuit 13 is formed.

Figure 4E:
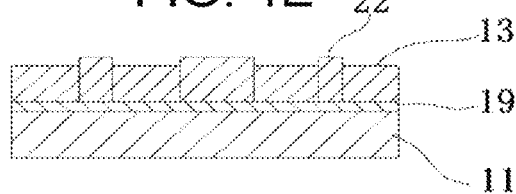
Figure 4F:
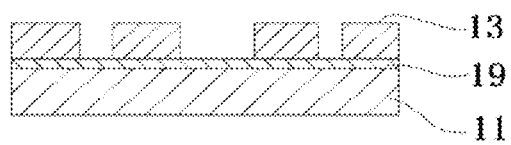
Figure 4G:

Thereafter, as illustrated in FIG. 4E, for example, electrolytic copper plating as a conductor metal is deposited by electrolytic plating on a portion of the electroless copper plating layer 19 that is not covered by the patterned plating resist layer 22, and the lower-layer conductor circuit 13 is formed by the electrolytic copper plating layer. Next, as illustrated in FIG. 4F, the patterned plating resist layer 22, for example, is peeled and removed. Further, as illustrated in FIG. 4G, a portion of the electroless copper plating layer 19 that is not covered by the lower-layer conductor circuit 13 and is exposed is removed, for example, by etching, and an electroless copper plating layer 23 having the same pattern as the lower-layer conductor circuit 13 is formed. Then, the upper-layer insulating resin layer 14 is formed, for example, by laminating a resin film on the lower-layer insulating resin layer 11 and the lower-layer conductor circuit 13 and applying pressure and heat to the resin film. Thereafter, by the same processes as described above, the upper-layer electroless copper plating layer and the upper-layer conductor circuit 16 are formed. As a result, a printed wiring board that is the same as that illustrated in FIG. 1 is manufactured.

Therefore, in the case where a printed wiring board is manufactured using the method of the present embodiment based on a full-additive method, as compared to the case where the same printed wiring board is manufactured using a semi-additive method, the formation of the plating resist layer and the electrolytic copper plating layer for forming the conductor circuit, the peeling and removal of the plating resist layer, and the process of etching or the like of the electroless copper plating layer as a seed layer are not required so that the number of processes is reduced, and thus the printed wiring board can be manufactured at a low cost.

In addition, when a printed wiring board is manufactured using the manufacturing method of the present embodiment based on a full-additive method, since the thin photosensitive catalyst film 17 for forming a wiring layer by electroless plating is patterned by performing mask exposure or by using an inkjet, a resolution capability of fine wiring can be improved as compared to the case of a method based on a conventional full-additive method, and since a permanent resist as an insulating material between wirings of the conductor circuit 13 does not remain, reliability of fine wiring can be improved as compared to the case of a method based on a conventional full-additive method.

Figure 5A:
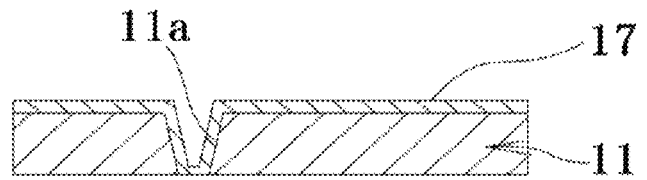
FIG. 5A-5D are explanatory diagrams illustrating a method for manufacturing a printed wiring board according to another embodiment of the present invention, the printed wiring board having a via hole conductor.

FIG. 5A-5D are explanatory diagrams illustrating a method, based on a full-additive method, for manufacturing a printed wiring board according to another embodiment of the present invention, the printed wiring board having a via hole conductor. In the method for manufacturing a printed wiring board of the present embodiment, when a printed wiring board that is similar to the printed wiring board illustrated in FIG. 1 and has a via hole conductor is manufactured, first, as illustrated in FIG. 5A, the lower-layer insulating resin layer 11 as an insulating layer is prepared. A through hole (11a) for a via hole is formed in the lower-layer insulating resin layer 11, for example, using laser. A liquid photosensitive catalyst is applied on a first surface, which is an upper side surface in the figure of the lower-layer insulating resin layer 11 and on a side wall surface of the through hole (11a), and a thin photosensitive catalyst film 17 having a thickness of, for example, about 0.02 μm-0.5 μm is formed.

Similar to the above embodiment, as a material of the lower-layer insulating resin layer 11, for example, polyimide, epoxy, acrylic, PET, and the like can be used. As insulating layers, in addition to the resin layers, a glass substrate or the like can also be used. Further, as a material of the photosensitive catalyst film 17, for example, "HYPERTECH (registered trademark) PL-series photosensitive electroless plating nucleating agent" manufactured by Nissan Chemical Industries, Ltd. can be used.

Figure 5B:
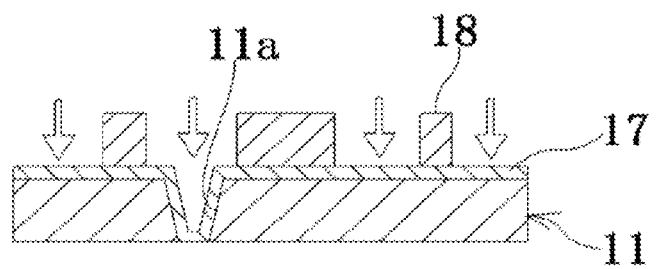
Figure 5C:
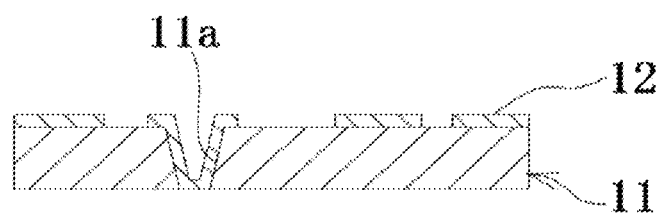

Next, as illustrated in FIG. 5B, the mask 18 that is patterned corresponding to the lower-layer conductor circuit 13 is positioned on the photosensitive catalyst film 17. Via the mask 18, the photosensitive catalyst film 17 is exposed, for example, with ultraviolet light as indicated by arrows in FIG. 5B, and an exposed portion of the photosensitive catalyst film 17 is cured. Next, as illustrated in FIG. 5C, after the mask 18 is removed, an uncured portion of the photosensitive catalyst film 17 is removed using a liquid developer, and the patterned catalyst film 12 that is patterned corresponding to the lower-layer conductor circuit 13 is formed.

Figure 8A:
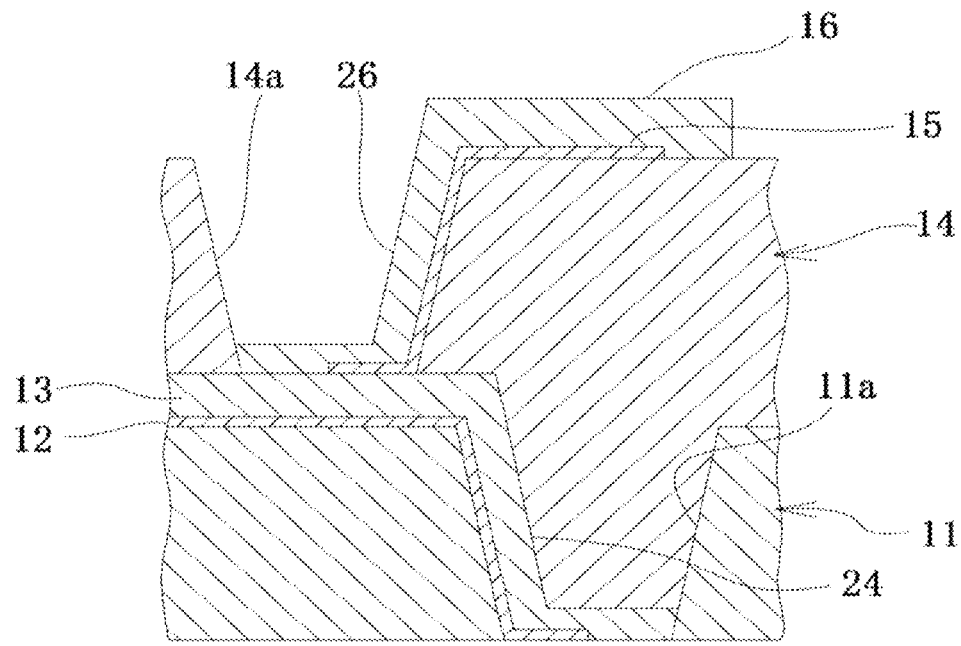
FIG. 8A is an enlarged cross-sectional view that schematically illustrates a printed wiring board having a via hole conductor according to another embodiment of the present invention, the printed wiring board being manufactured using a method for manufacturing a printed wiring board of yet another embodiment of the present invention.
Figure 8B:
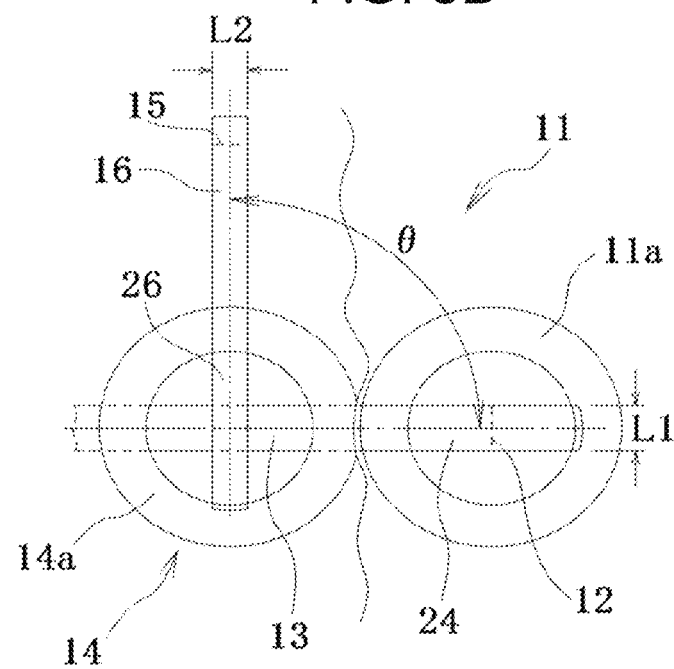
FIG. 8B is a partial cutaway plan view that schematically illustrates a portion of a modified embodiment of the printed wiring board of the embodiment illustrated in FIG. 8A, the portion being the same portion illustrated in FIG. 8A.

The via hole conductor electrically connects the lower-layer conductor circuit 13, which is on the first surface on the upper side in the figure of the lower-layer insulating resin layer 11, and a further-lower-layer conductor circuit (not illustrated in the drawings), which is in contact with a second surface on a lower side in the figure of the lower-layer insulating resin layer 11. Therefore, the photosensitive catalyst film 17 is also formed on the further-lower-layer conductor circuit that is exposed to a bottom part of the through hole (11a) for a via hole in the lower-layer insulating resin layer 11. Therefore, when the low conductivity "HYPERTECH (registered trademark) PL-series photosensitive electroless plating nucleating agent" is used as the material of the photosensitive catalyst film 17, it is desirable that the portion of the photosensitive catalyst film 17 on the further-lower-layer conductor circuit that is exposed to the bottom part of the through hole (11a) for a via hole be also at least partially covered by the mask 18 and be removed as an unexposed portion using a liquid developer, and, as illustrated in FIGS. 8A and 8B (to be described later), the further-lower-layer conductor circuit be at least partially exposed to the bottom part of the through hole (11a) and an electroless plating layer be directly formed on the exposed portion of the further-lower-layer conductor circuit. This allows conductivity of the via hole conductor to be increased. On the other hand, when the patterned catalyst film 12 is formed by printing a high conductivity catalyst in a pattern, for example, using an inkjet of an inkjet printer, instead of the pattern exposure and development processing of the photosensitive catalyst film 17, as illustrated in FIG. 5C, the patterned catalyst film 12 may be formed to extend to the bottom part of the through hole (11a).

Figure 5D:
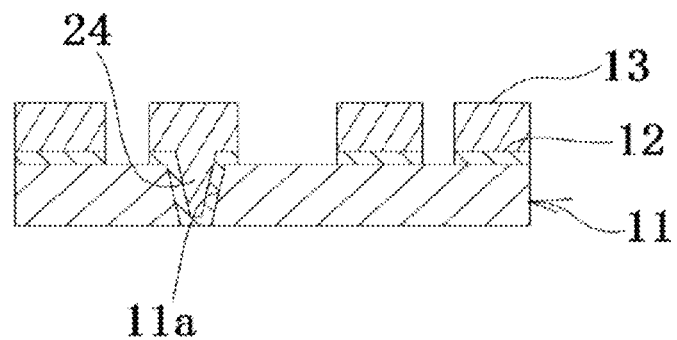

Thereafter, as illustrated in FIG. 5D, for example, electroless copper plating as a conductor metal is deposited on the patterned catalyst film 12 by electroless plating, and the lower-layer conductor circuit 13 and the via hole conductor 24 in the through hole (11a) are formed by the electroless copper plating. Then, the upper-layer insulating resin layer 14 is formed, for example, by laminating a resin film on the lower-layer insulating resin layer 11 and the lower-layer conductor circuit 13 and applying pressure and heat to the resin film. Thereafter, by the same processes as described above, the upper-layer patterned catalyst film 15 and the upper-layer conductor circuit 16 are formed. As a result, the printed wiring board is manufactured having the via hole conductor that electrically connects the lower-layer conductor circuit 13 and the upper-layer conductor circuit 16.

Figure 6A:
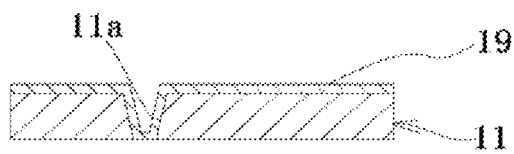
FIG. 6A-6G are explanatory diagrams illustrating a method, based on a semi-additive method, for manufacturing a printed wiring board having a via hole conductor.
Figure 6B:
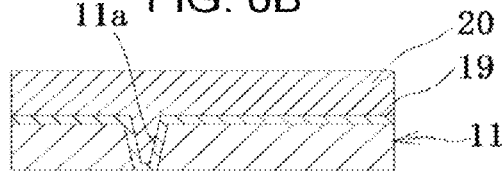

FIG. 6A-6G are explanatory diagrams illustrating a method, based on a semi-additive method, for manufacturing a printed wiring board that is similar to the printed wiring board illustrated in FIG. 1 and has a via hole conductor. In this case, first, as illustrated in FIG. 6A, the lower-layer insulating resin layer 11 as an insulating layer is prepared. The through hole (11a) for a via hole is formed in the lower-layer insulating resin layer 11, for example, using laser. A catalyst nucleus (not illustrated in the drawings) is added on a surface of the lower-layer insulating resin layer 11 and on a side wall surface of the through hole (11a). Due to the catalyst nucleus, for example, an electroless copper plating layer 19 as a seed layer is formed on the surface of the lower-layer insulating resin layer 11 and on the side wall surface of the through hole (11a) by an electroless plating treatment. Next, as illustrated in FIG. 6B, a photosensitive plating resist layer 20 is formed on the electroless copper plating layer 19.

Figure 6C:
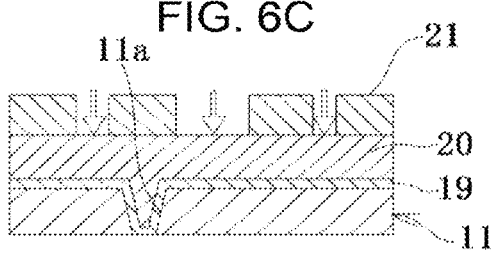
Figure 6D:

Next, as illustrated in FIG. 6C, a mask 21 that is patterned corresponding to the lower-layer conductor circuit 13 is positioned on the photosensitive plating resist layer 20. Via the mask 21, the photosensitive plating resist layer 20 is exposed, for example, with ultraviolet light as indicated by arrows in FIG. 6C, and an exposed portion of the photosensitive plating resist layer 20 is cured. Next, as illustrated in FIG. 6D, after the mask 21, an uncured portion of the photosensitive plating resist layer 20 is removed using a liquid developer, and a patterned plating resist layer 22 that is patterned corresponding to the lower-layer conductor circuit 13 is formed.

Figure 6E:
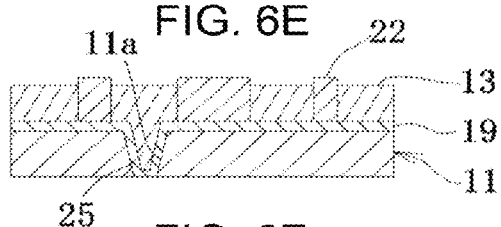
Figure 6F:
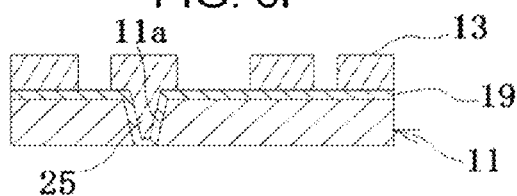
Figure 6G:
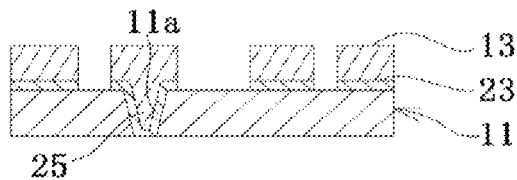

Thereafter, as illustrated in FIG. 6E, for example, electrolytic copper plating as a conductor metal is deposited by electrolytic plating on a portion of the electroless copper plating layer 19 that is not covered by the patterned plating resist layer 22, and the lower-layer conductor circuit 13 and a via hole conductor 25 inside the through hole (11a) are formed by the electrolytic copper plating. Next, as illustrated in FIG. 6F, the patterned plating resist layer 22, for example, is peeled and removed. Further, as illustrated in FIG. 6G, a portion of the electroless copper plating layer 19 that is not covered by the lower-layer conductor circuit 13 and is exposed is removed, for example, by etching, and an electroless copper plating layer 23 having the same pattern as the lower-layer conductor circuit 13 is formed. Then, the upper-layer insulating resin layer 14 is formed, for example, by laminating a resin film on the lower-layer insulating resin layer 11 and the lower-layer conductor circuit 13 and applying pressure and heat to the resin film. Thereafter, by the same processes as described above, the upper-layer patterned catalyst film and the upper-layer conductor circuit 16 are formed. As a result, the printed wiring board is manufactured having the via hole conductor that electrically connects the lower-layer conductor circuit 13 and the upper-layer conductor circuit 16.

Therefore, also in the case where a printed wiring board having a via hole conductor is manufactured using the method of the present embodiment based on a full-additive method, as compared to the case where the same printed wiring board is manufactured using a semi-additive method, the formation of the plating resist layer and the electrolytic copper plating layer for forming the conductor circuit, the peeling and removal of the plating resist layer, and the process of etching or the like of the electroless copper plating layer as a seed layer are not required so that the number of processes is reduced, and thus the printed wiring board can be manufactured at a low cost.

Figure 7:
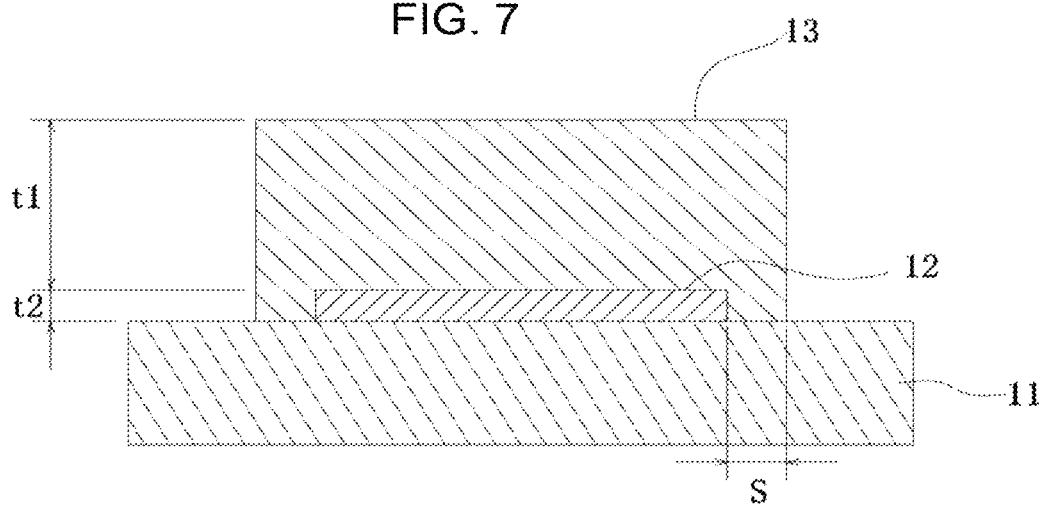
FIG. 7 is an enlarged cross-sectional view that schematically illustrates a printed wiring board of an embodiment of the present invention, the printed wiring board being manufactured using the method for manufacturing a printed wiring board of the embodiment of the present invention illustrated in FIG. 3A-3D or FIG. 5A-5D.

FIG. 7 is an enlarged cross-sectional view that schematically illustrates a printed wiring board of an embodiment of the present invention, the printed wiring board being manufactured using the method for manufacturing a printed wiring board of the embodiment of the present invention illustrated in FIG. 3A-3D or FIG. 5A-5D. In the manufacturing method of the present embodiment, when the lower-layer conductor circuit 13 is formed, for example, by depositing copper plating by electroless plating on the patterned catalyst film 12 that is formed on the surface of the lower-layer insulating resin layer 11, high-speed electroless copper plating may be performed, for example, using an electroless copper plating solution "THRU-CUP PMK (trade name)" manufactured by Uyemura & Co., Ltd. In this case, when an anti-adhesive agent is mixed in the platting solution, the deposition of the copper plating is slower near a side surface of the patterned catalyst film 12 than it is near an upper surface of the patterned catalyst film 12, the flow of the electroless plating solution being slower near the side surface of the patterned catalyst film 12 than it is near the upper surface of the patterned catalyst film 12. As a result, anisotropic growth of the copper plating (anisotropy in deposition amount) occurs and, for example, when the copper plating on the upper surface of the patterned catalyst film 12 grows to have a thickness of t1=5-15 μm, the copper plating on the side surface of the patterned catalyst film 12 grows to have a thickness of S=2-3 μm, and thus the conductor circuit can be formed at a fine pitch. A ratio of the deposition amount of the electroless copper plating near the upper surface of the patterned catalyst film 12 to the deposition amount of the electroless copper plating near the side surface of the patterned catalyst film 12 is about 1.5-5.

When the thickness (t1) of the copper plating that forms the conductor circuit 13 is less than 5 μm, a resistance of the conductor circuit becomes large. When the thickness (t1) exceeds 15 μm, in the case where a glass substrate is used in place of the insulating resin layer 11 for a touch panel or the like, an amount of light transmission may be insufficient. It is preferable that the patterned catalyst film 12 have a thickness (t2) of 0.02-0.5 μm in order to improve catalyst coating efficiency and mask exposure accuracy.

FIG. 8A is an enlarged cross-sectional view that schematically illustrates a multilayer printed wiring board having a via hole conductor according to another embodiment of the present invention, the multilayer printed wiring board being manufactured using a method for manufacturing a printed wiring board of yet another embodiment of the present invention. FIG. 8B is a partial cutaway plan view that schematically illustrates a portion of a modified embodiment of the printed wiring board of the embodiment illustrated in FIG. 8A, the portion being the same portion illustrated in FIG. 8A. In FIGS. 8A and 8B, portions that are the same as in FIGS. 1 and 5A-5D are indicated using the same reference numeral symbols.

The multilayer printed wiring board illustrated in FIG. 8A also includes: a lower-layer insulating resin layer 11 as an insulating layer; a lower-layer patterned catalyst film 12 that is formed on the lower-layer insulating resin layer 11; and a lower-layer conductor circuit 13 that is formed of an electroless plating metal, such as electroless copper plating, deposited on the lower-layer patterned catalyst film 12, and also includes: an upper-layer insulating resin layer 14 as another insulating layer that is laminated and formed so as to cover the lower-layer insulating resin layer 11 and the lower-layer conductor circuit 13; an upper-layer patterned catalyst film 15 that is formed on the upper-layer insulating resin layer 14; and an upper-layer conductor circuit 16 that is formed of an electroless plating metal, such as electroless copper plating, deposited on the upper-layer patterned catalyst film 15.

In the multilayer printed wiring board, the lower-layer insulating resin layer 11 has a through hole (11a); and the lower-layer patterned catalyst film 12 is formed extending on a portion of a side wall surface of the through hole (11a) and on a portion of a further-lower-layer conductor circuit (not illustrated in the drawings) that is exposed from the through hole (11a). The multilayer printed wiring board has a lower-layer via hole conductor 24 that is formed of an electroless plating metal, such as electroless copper plating, deposited on the lower-layer patterned catalyst film 12 and on the further-lower-layer conductor circuit and electrically connects the further-lower-layer conductor circuit and the lower-layer conductor circuit 13.

In the multilayer printed wiring board, the upper-layer insulating resin layer 14 has a through hole (14a); and the upper-layer patterned catalyst film 15 is formed extending on a portion of a side wall surface of the through hole (14a) and on a portion of the lower-layer conductor circuit 13 that is exposed from the through hole (14a). The multilayer printed wiring board has an upper-layer via hole conductor 26 that is formed of an electroless plating metal, such as electroless copper plating, deposited on the upper-layer patterned catalyst film 15 and on the lower-layer conductor circuit 13 and electrically connects the lower-layer conductor circuit 13 and the upper-layer conductor circuit 16.

In both the multilayer printed wiring board illustrated in FIG. 8A and the multilayer printed wiring board of the modified embodiment illustrated in FIG. 8B (to be described later), the lower-layer patterned catalyst film 12 is formed in a belt-like shape. As a result, the lower-layer conductor circuit 13 and the lower-layer via hole conductor 24 are each formed in a thin belt-like shape having a width (L1). Further, the upper-layer patterned catalyst film 15 is also formed in a belt-like shape. As a result, the upper-layer conductor circuit 16 and the upper-layer via hole conductor 26 are each formed in a thin belt-like shape having a width (L2). The width (L1) of the lower-layer via hole conductor 24 and the width (L2) of the upper-layer via hole conductor 26 can be freely designed, for example, can be respectively set to be narrower than inner diameters of bottom parts of the through holes (11a, 14a). The via hole conductors (24, 26) do not have lands that surround upper ends of the through holes (11a, 14a). Therefore, design flexibility of wirings of the lower-layer conductor circuit 13 and the upper-layer conductor circuit 16 that connect to the via hole conductors (24, 26) is increased.

In the multilayer printed wiring board illustrated in FIG. 8A, the lower-layer conductor circuit 13 and the upper-layer conductor circuit 16 are wired parallel to each other in a plan view. However, in the multilayer printed wiring board of the modified embodiment illustrated in FIG. 8B, the lower-layer conductor circuit 13 and the upper-layer conductor circuit 16 are wired to have an angle relative to each other in a plan view, such an angle of about 90 degrees in the example of FIG. 8B. As long as the via hole conductor 26 is connected to the lower-layer conductor circuit 13, an orientation relative to the lower-layer conductor circuit 13 does not matter. Therefore, the design flexibility of the wiring of the upper-layer conductor circuit 16 that connects to the via hole conductor 26 is increased.

Figure 9A:
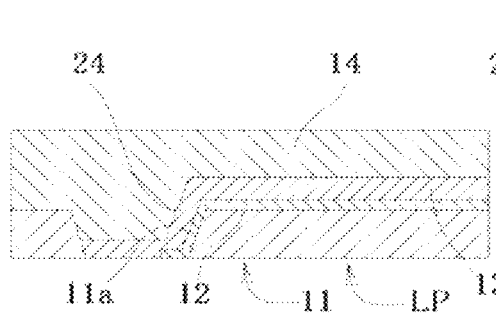
FIG. 9A-9H are explanatory diagrams illustrating a method for manufacturing a printed wiring board having a via hole conductor of the embodiment.

FIG. 9A-9H are explanatory diagrams illustrating a method for manufacturing a printed wiring board having a via hole conductor according to the above embodiment and the modified embodiment. In this case, first, as illustrated in FIG. 9A, a lower-layer printed wiring board (LP) is prepared that includes: a lower-layer insulating resin layer 11 as an insulating layer; a lower-layer patterned catalyst film 12 that is formed on the lower-layer insulating resin layer 11; a lower-layer conductor circuit 13 that is formed of an electroless plating metal deposited on the lower-layer patterned catalyst film 12; and a lower-layer via hole conductor 24 that is formed inside a through hole (11a) of the lower-layer insulating resin layer 11 and electrically connects the further-lower-layer conductor circuit and the lower-layer conductor circuit 13, and an upper-layer insulating resin layer 14 is formed, for example, by laminating a resin film on the lower-layer insulating resin layer 11, the lower-layer conductor circuit 13 and the lower-layer via hole conductor 24 of the lower-layer printed wiring board (LP) and applying pressure and heat to the resin film. The lower-layer printed wiring board (LP) is manufactured using a method that is the same as a method for manufacturing an upper-layer printed wiring board (UP) (to be described later).

Figure 9E:
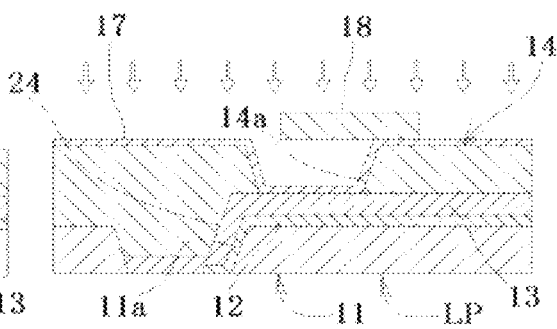
Figure 9B:
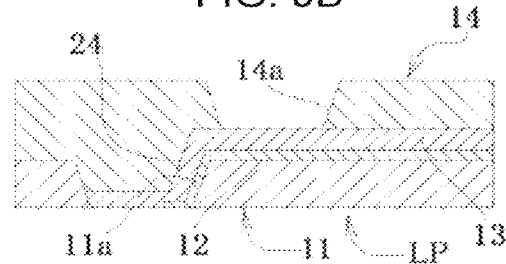

Next, as illustrated in FIG. 9B, a through hole (14a) is formed in the upper-layer insulating resin layer 14, for example, using laser. Next, as illustrated in FIG. 9C, a surface of the upper-layer insulating resin layer 14, an inner wall surface of the through hole (14a), and a surface of the lower-layer conductor circuit 13 that is exposed from the through hole (14a) are roughened to become a roughened surface 27, for example, by a desmear treatment in the through hole (14a) or the like.

Figure 9F:
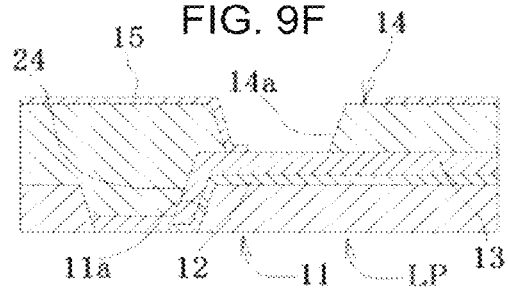
Figure 9C:
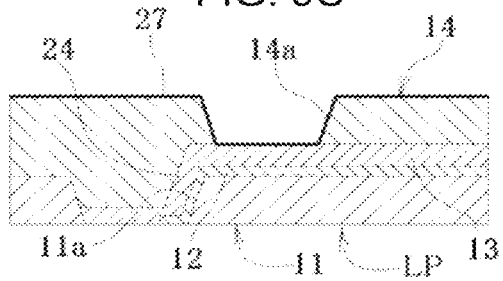
Figure 9G:
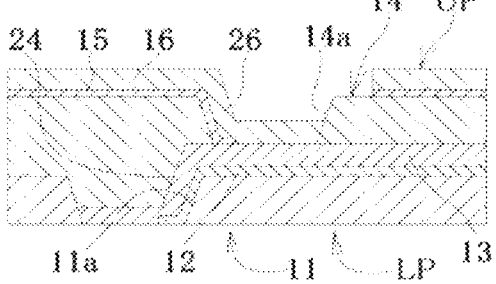
Figure 9D:
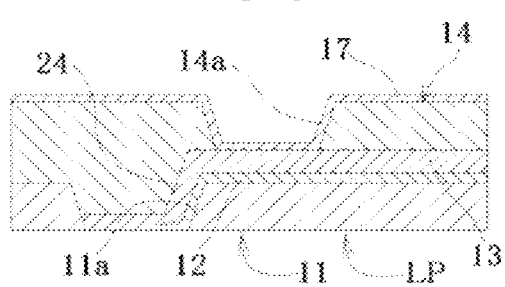

Next, as illustrated in FIG. 9D, a photosensitive catalyst film 17 is formed on the roughened surface 27. Next, as illustrated in FIG. 9E, a mask 18 that is patterned corresponding to an upper-layer conductor circuit 16 is positioned on the photosensitive catalyst film 17. Via the mask 18, the photosensitive catalyst film 17 is exposed, for example, with ultraviolet light as illustrated by arrows in FIG. 9E, and an exposed portion of the photosensitive catalyst film 17 is cured.

Next, as illustrated in FIG. 9F, after the mask 18 is removed, an uncured portion of the photosensitive catalyst film 17 is removed using a liquid developer, and a patterned catalyst film 15 that is patterned corresponding to the upper-layer conductor circuit 16 is formed. The patterned catalyst film 15 is also formed on a portion in a circumferential direction of the inner wall surface of the through hole (14a), and is also formed on a portion of the surface of the lower-layer conductor circuit 13 that connects to a portion of the inner wall surface of the through hole (14a) and is exposed from the through hole (14a).

Thereafter, as illustrated in FIG. 9G, for example, electroless copper plating as a conductor metal is deposited on the patterned catalyst film 15 by electroless plating, and the upper-layer conductor circuit 16 and an upper-layer via hole conductor 26 that electrically connects the lower-layer conductor circuit 13 and the upper-layer conductor circuit 16 are formed by the electroless copper plating. The upper-layer printed wiring board (UP) is laminate and formed on the lower-layer printed wiring board (LP), and the multilayer printed wiring board having the via hole conductors is manufactured.

Figure 9H:
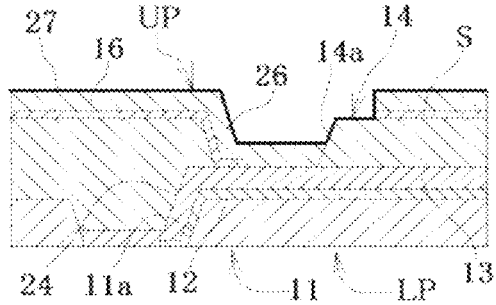

When necessary, as illustrated in FIG. 9H, surfaces of the upper-layer insulating resin layer 14, the upper-layer conductor circuit 16 and the upper-layer via hole conductor 26 of the upper-layer printed wiring board (UP) are roughened by a roughening treatment to become a roughened surface 27, and thereafter, by the same processes as described above, one or more printed wiring boards may be further laminated and formed on the roughened surface 27.

According to the method for manufacturing a printed wiring board of the present embodiment and the modified embodiment, the via hole conductors (24, 26) are respectively directly connected to the lower-layer conductor circuit 13 and the like that are respectively below the via hole conductors (24, 26). Therefore, as compared to the case where the connection is via the catalyst films (12, 15), connection resistances of the via hole conductors can be reduced.

Figure 10A:
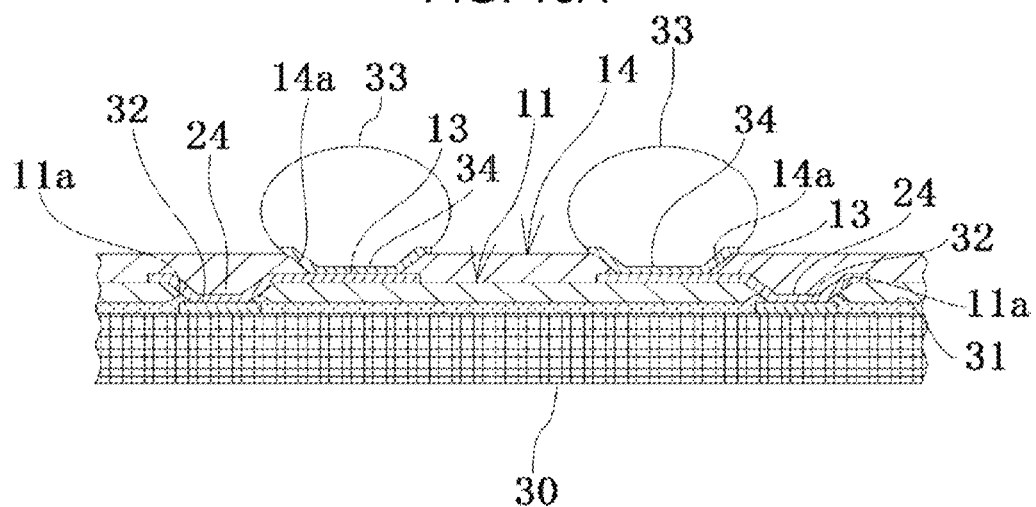
FIGS. 10A and 10B are each a cross-sectional view illustrating a rewiring type wafer level package as a printed wiring board of yet another embodiment of the present invention, the rewiring type wafer level package being provided with a rewiring layer that has a via hole conductor and a conductor circuit and being manufactured using the manufacturing method of the embodiment illustrated in FIG. 5A-5D, FIG. 10A illustrating a fan-in type rewiring layer, and FIG. 10B illustrating a fan-out type rewiring layer.
Figure 10B:
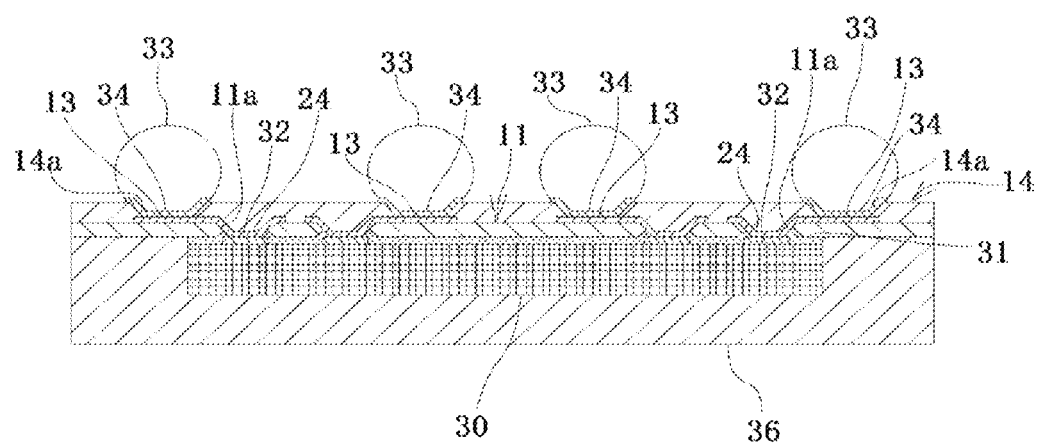

FIG. 10A is a cross-sectional view illustrating a rewiring type wafer level package having a fan-in type rewiring layer as an example of printed wiring board of yet another embodiment of the present invention provided with a rewiring layer having a via hole conductor and a conductor circuit manufactured using the manufacturing method of the embodiment illustrated in FIG. 5A-5D. FIG. 10B is a cross-sectional view illustrating a rewiring type wafer level package provided with a fan-out type rewiring layer as another example of the printed wiring board of the embodiment.

In the rewiring type wafer level package illustrated in FIG. 10A, a connection terminal 32 as a lower-layer conductor layer is further provided in a projecting manner on an upper surface of a semiconductor element 30 that is embedded in a resin insulating layer (not illustrated in the drawings), the upper surface being covered by an insulating protective film 31. A central part of the connection terminal 32 is exposed from an opening part that is formed in the protective film 31.

The wafer level package also includes: a lower-layer insulating resin layer 11 that is formed on the protective film 31; a lower-layer patterned catalyst film (not illustrated in the drawings) that is formed on the lower-layer insulating resin layer 11; a lower-layer conductor circuit 13 that is formed of an electroless plating metal deposited on the lower-layer patterned catalyst film; and a lower-layer via hole conductor 24 that is formed inside a through hole (11*a*) of the lower-layer insulating resin layer 11 and electrically connects the connection terminal 32 and the lower-layer conductor circuit 13. The lower-layer conductor circuit 13 extends more inwardly than the lower-layer via hole conductor 24 and forms a fan-in type rewiring layer.

The wafer level package further includes: an upper-layer insulating resin layer 14 that is formed on the lower-layer insulating resin layer 11, the lower-layer conductor circuit 13 and the lower-layer via hole conductor 24 and exposes a portion of the lower-layer conductor circuit 13 from a through hole (14*a*); and a connection pad 34 as an upper-layer conductor circuit that is formed in the through hole (14*a*) of the upper-layer insulating resin layer 14 and connects to the lower-layer conductor circuit 13, and on which, for example, a solder bump 33 formed of a solder ball is provided. By forming the fan-in type rewiring layer, a pitch of connection pads 34 can be smaller than a pitch of connection terminals 32 of the semiconductor element 30.

Also in the rewiring type wafer level package illustrated in FIG. 10B, a connection terminal 32 as a lower-layer conductor layer is further provided in a projecting manner on an upper surface of a semiconductor element 30 that is embedded in a resin insulating layer 36, the upper surface being covered by an insulating protective film 31. A central part of the connection terminal 32 is exposed from an opening part that is formed in the protective film 31.

The wafer level package also includes: a lower-layer insulating resin layer 11 that is formed on the base resin insulating layer 36 and the protective film 31; a lower-layer patterned catalyst film (not illustrated in the drawings) that is formed on the lower-layer insulating resin layer 11; a lower-layer conductor circuit 13 that is formed of an electroless plating metal deposited on the lower-layer patterned catalyst film; and a lower-layer via hole conductor 24 that is formed inside a through hole (11*a*) of the lower-layer insulating resin layer 11 and electrically connects the connection terminal 32 and the lower-layer conductor circuit 13. A portion (on both outer sides in FIG. 10B) of the lower-layer conductor circuit 13 extends more outwardly than the lower-layer via hole conductor 24 and forms a fan-out type rewiring layer.

The wafer level package further includes: an upper-layer insulating resin layer 14 that is formed on the lower-layer insulating resin layer 11, the lower-layer conductor circuit 13 and the lower-layer via hole conductor 24 and exposes a portion of the lower-layer conductor circuit 13 from a through hole (14*a*); and a connection pad 34 as an upper-layer conductor circuit that is formed in the through hole (14*a*) of the upper-layer insulating resin layer 14 and connects to the lower-layer conductor circuit 13, and on which, for example, a solder bump 33 formed of a solder ball is provided. By forming the fan-out type rewiring layer, a pitch of connection pads 34 can be larger than a pitch of connection terminals 32 of the semiconductor element 30. At a central part of this wafer level package, a fan-in type rewiring layer that is the same as the one illustrated in FIG. 10A is also provided.

Figure 11:
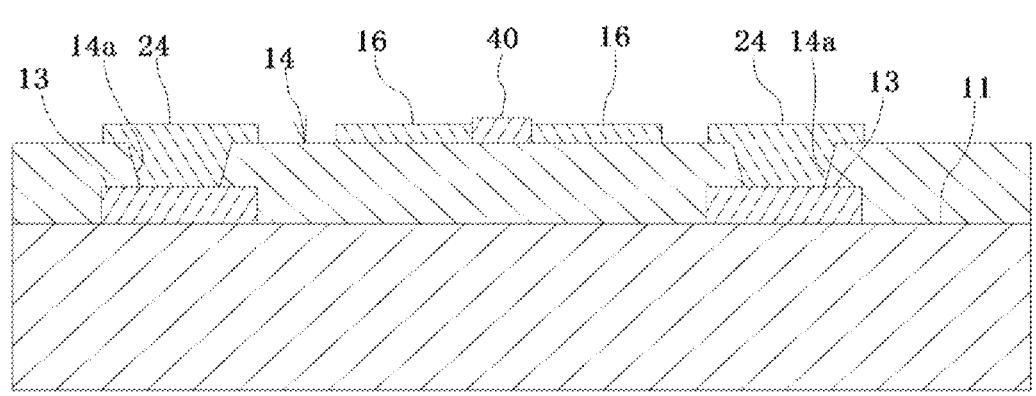
FIG. 11 is a cross-sectional view illustrating a printed wiring board of yet another embodiment of the present invention, the printed wiring board having a modified wiring for connecting a broken wiring and being manufactured using the manufacturing method of the embodiment illustrated in FIG. 3A-3D.

FIG. 11 is a cross-sectional view illustrating a printed wiring board of yet another embodiment of the present invention, the printed wiring board having a modified wiring for connecting a broken wiring and being manufactured using the manufacturing method of the embodiment illustrated in FIG. 3.

This printed wiring board includes: a lower-layer conductor circuit 13 that is formed on a lower-layer insulating resin layer 11 using a common method such as an additive method, a semi-additive method or a subtractive method; an upper-layer insulating resin layer 14 as an insulating layer that is formed on the lower-layer insulating resin layer 11 and the lower-layer conductor circuit 13; an upper-layer conductor circuit 16 that is formed on the upper-layer insulating resin layer 14 in the same manner as the lower-layer conductor circuit 13; and a via hole conductor 24 that is formed in the same manner as the upper-layer conductor circuit 16 and is formed a through hole (14*a*) of the upper-layer insulating resin layer 14 and electrically connects the lower-layer conductor circuit 13 and the upper-layer conductor circuit 16, and also includes: a patterned catalyst film (not illustrated in the drawings) that is formed of a catalyst for electroless plating formed on a surface of the upper-layer insulating resin layer 14 in a broken part occurring in the upper-layer conductor circuit 16 and has a pattern corresponding to the original conductor circuit of the broken part; and a modified conductor circuit 40 that is formed on the patterned catalyst film and connects the broken part, and is formed of, for example, electroless copper plating as an electroless plating conductor metal. As a result, the broken part of the upper-layer conductor circuit 16 can be easily connected and the conductor circuit can be modified. On the upper-layer insulating resin layer 14, the upper-layer conductor circuit 16, the via hole conductor 24 and the modified conductor circuit 40, one or more insulating resin layers and conductor circuits may be laminated, and upper and lower conductor circuits of an insulating resin layer may be connected by a via hole conductor.

A method for manufacturing a printed wiring board according to an embodiment of the present invention is not limited to the above-described embodiments, but can be appropriately modified within the scope of the appended claims. For example, in the lower-layer conductor circuit 13 or the upper-layer conductor circuit 16, on the conductor metal deposited by electroless plating, using the conductor metal as an electrode, more conductor metal may be deposited by electrolytic plating to increase the thickness of the conductor circuit.

FIG. 2 is a cross-sectional view that schematically illustrates a printed wiring board manufactured using a conventional full-additive method. In this case, the printed wiring board is manufactured through processes including: forming a lower-layer catalyst layer 2 on a lower-layer insulating interlayer resin layer 1; forming a lower-layer plating resist 3, which is patterned corresponding to a lower-layer conductor circuit, on the lower-layer catalyst layer 2; forming a lower-layer conductor circuit 4 by forming a copper plating layer by electroless plating in a portion where the lower-layer plating resist 3 is not formed; laminating and forming an upper-layer insulating interlayer resin layer 5 on the lower-layer plating resist 3 and on the lower-layer conductor circuit 4; forming an upper-layer catalyst layer 6 on the upper-layer insulating interlayer resin layer 5; forming an upper-layer plating resist 7, which is patterned corresponding to an upper-layer conductor circuit, on the upper-layer catalyst layer 6; and providing an upper-layer conductor circuit 8 by forming a copper plating layer by electroless plating in a portion where the upper-layer plating resist 7 is not formed.

In this way, in the conventional full-additive method, the thick plating resists (3, 7) for forming copper plating layers by electroless plating are patterned by mask exposure. Therefore, as compared to other wiring processes, resolution capability of fine wiring is likely to decrease. Further, the plating resists (3, 7) become permanent resists that remain as insulating materials between wirings of the lower-layer conductor circuit 4 and the upper-layer conductor circuit 6 and are used as final structural materials. Therefore, as compared to other wiring processes, reliability of fine wiring is likely to decrease.

A full-additive method according to an embodiment of the present invention improves resolution capability and reliability of fine wiring in a wiring process.

A method for manufacturing a printed wiring board according to an embodiment of the present invention is characterized in that, when a printed wiring board is formed that includes an insulating layer and a conductor circuit that is formed on a surface of the insulating layer, a patterned catalyst film that is formed of a catalyst for electroless plating and has a pattern corresponding to the conductor circuit is formed on the surface of the insulating layer, and the conductor circuit is formed by depositing a conductor metal by electroless plating on the patterned catalyst film.

Further, a printed wiring board according to an embodiment of the present invention is characterized in that, in a printed wiring board that includes an insulating layer and a conductor circuit that is formed on a surface of the insulating layer, a patterned catalyst film is provided that is formed of a catalyst for electroless plating formed on the surface of the insulating layer and has a pattern corresponding to the conductor circuit, and the conductor circuit is formed of an electroless plating conductor metal deposited on the patterned catalyst film.

In an embodiment of the present invention, the patterned catalyst film may be formed by forming a photosensitive catalyst film for electroless plating on the surface of the insulating layer and subjecting the catalyst film for electroless plating to mask exposure and development. The patterned catalyst film may also be formed by printing using an inkjet on the surface of the insulating layer.

Further, in an embodiment of the present invention, it is also possible that the surface of the insulating layer is a first surface; the conductor circuit is an upper-layer conductor circuit; the insulating layer has a via hole opening; the printed wiring board includes a lower-layer conductor circuit, which is in contact with a second surface that is on an opposite side of the surface of the insulating layer, and includes a via hole conductor in the through hole of the insulating layer, the via hole conductor electrically connecting the upper-layer conductor circuit and the lower-layer conductor circuit; the patterned catalyst film is also formed on a portion of a side wall of the through hole of the insulating layer and on a portion of the lower-layer conductor circuit that is exposed from the through hole; and the via hole conductor is formed by depositing a conductor metal by electroless plating on the patterned catalyst film.

Further, in an embodiment of the present invention, it is also possible that the conductor circuit or the via hole conductor is formed by further depositing a conductor metal by electrolytic plating on the conductor metal that is deposited by the electroless plating.

Further, in an embodiment of the present invention, it is also possible that the conductor metal that is deposited by the electroless plating or by the electrolytic plating is copper, nickel, silver, palladium, tin, cobalt or gold.

Obviously, numerous modifications and variations of the present invention are possible in light of the above teachings. It is therefore to be understood that within the scope of the appended claims, the invention may be practiced otherwise than as specifically described herein.

The invention claimed is:

1. A method for manufacturing a printed wiring board, comprising:
    forming, on a surface of an insulating layer, a patterned catalyst film comprising a catalyst for electroless plating such that the patterned catalyst film has a pattern corresponding to a conductor circuit; and
    applying electroless plating on the patterned catalyst film such that a conductor metal is deposited on the patterned catalyst film and that the conductor circuit is formed on the surface of the insulating layer such that the conductor metal is formed on upper and side surfaces of the patterned catalyst film and that the conductor metal has deposition amounts that are greater on the upper surface of the patterned catalyst film than the side surface of the patterned catalyst film,
    wherein the forming of the patterned catalyst film comprises forming the patterned catalyst film on the surface of the insulating layer and in a via hole opening formed in the insulating layer, and the applying of electroless plating comprises applying electroless plating on the patterned catalyst film such that the conductor metal is deposited on the patterned catalyst film and that the conductor circuit is formed on the surface of the insulating layer and a via hole conductor is formed in the via hole opening in the insulating layer.

2. A method for manufacturing a printed wiring board according to claim 1, wherein the forming of the patterned catalyst film comprises forming a photosensitive catalyst film for electroless plating on the surface of the insulating layer and subjecting the photosensitive catalyst film to exposure and development such that the patterned catalyst film is formed on the surface of the insulating layer.

3. A method for manufacturing a printed wiring board according to claim 1, wherein the forming of the patterned catalyst film comprises printing the catalyst on the surface of the insulating layer by inkjet such that the patterned catalyst film is formed on the surface of the insulating layer.

4. A method for manufacturing a printed wiring board according to claim 1, wherein the applying of electroless plating comprises applying electroless plating such that the conductor metal is deposited in anisotropic growth with respect to amounts of the conductor metal on the upper surface and the side surface of the patterned catalyst film and that the deposition amounts of the conductor metal on the upper and side surfaces have a ratio in a range of about 1.5 to 5.

5. A method for manufacturing a printed wiring board according to claim 1, wherein the applying of electroless plating comprises applying electroless plating on the patterned catalyst film such that the conductor metal comprising one of copper, nickel, silver, palladium, tin, cobalt and gold is deposited on the patterned catalyst film.

6. A method for manufacturing a printed wiring board according to claim 1, further comprising:
    applying electrolytic plating on the conductor metal deposited by the electroless plating such that a second conductor metal is deposited on the conductor metal deposited by the electroless plating and that the conductor circuit is formed on the surface of the insulating layer.

7. A method for manufacturing a printed wiring board according to claim 6, wherein the applying of electrolytic plating comprises applying electrolytic plating on the conductor metal deposited by the electroless plating such that the second conductor metal comprising one of copper, nickel, silver, palladium, tin, cobalt and gold is deposited on the conductor metal deposited by the electroless plating and that the conductor circuit is formed on the surface of the insulating layer.

8. A method for manufacturing a printed wiring board according to claim 2, wherein the applying of electroless plating comprises applying electroless plating such that the conductor metal is deposited in anisotropic growth with respect to amounts of the conductor metal on the upper surface and the side surface of the patterned catalyst film and that the deposition amounts of the conductor metal on the upper and side surfaces have a ratio in a range of about 1.5 to 5.

9. A method for manufacturing a printed wiring board according to claim 2, wherein the applying of electroless plating comprises applying electroless plating on the patterned catalyst film such that the conductor metal comprising one of copper, nickel, silver, palladium, tin, cobalt and gold is deposited on the patterned catalyst film.

10. A printed wiring board, comprising:
an insulating layer, and
a conductor circuit formed on a surface of the insulating layer and comprising a patterned catalyst film formed on the surface of the insulating layer and a conductor metal deposited on the patterned catalyst film,
wherein the patterned catalyst film has a pattern corresponding to the conductor circuit and comprises a catalyst for electroless plating, the conductor metal comprises an electroless plating metal deposited on the patterned catalyst film such that the conductor metal is formed on upper and side surfaces of the patterned catalyst film and that the conductor metal has deposition amounts that are greater on the upper surface of the patterned catalyst film than the side surface of the patterned catalyst film, the conductor circuit includes a via hole conductor such that the via hole conductor is formed in a via hole opening formed in the insulating layer, and the via hole conductor comprises the patterned catalyst film formed in the via hole opening in the insulating layer and the conductor metal deposited on the patterned catalyst film in the via hole opening in the insulating layer.

11. A printed wiring board according to claim 10, wherein the patterned catalyst film comprises a photosensitive catalyst film for electroless plating subjected to exposure and development.

12. A printed wiring board according to claim 10, wherein the patterned catalyst film comprises the catalyst printed on the surface of the insulating layer by inkjet.

13. A printed wiring board according to claim 10, wherein the conductor metal is deposited in anisotropic growth with respect to amounts of the conductor metal on the upper surface and the side surface of the patterned catalyst film such that the deposition amounts of the conductor metal on the upper and side surfaces have a ratio in a range of about 1.5 to 5.

14. A printed wiring board according to claim 10, wherein the conductor metal comprises one of copper, nickel, silver, palladium, tin, cobalt and gold.

15. A printed wiring board according to claim 10, wherein the conductor circuit comprises the patterned catalyst film formed on the surface of the insulating layer, the conductor metal deposited on the patterned catalyst film and comprising an electroless plating metal, and a second conductor metal deposited on the conductor metal and comprising an electrolytic plating metal.

16. A printed wiring board according to claim 15, wherein the second conductor metal comprises one of copper, nickel, silver, palladium, tin, cobalt and gold.

17. A printed wiring board according to claim 11, wherein the conductor metal is deposited in anisotropic growth with respect to amounts of the conductor metal on the upper surface and the side surface of the patterned catalyst film such that the deposition amounts of the conductor metal on the upper and side surfaces have a ratio in a range of about 1.5 to 5.

18. A printed wiring board according to claim 11, wherein the conductor metal comprises one of copper, nickel, silver, palladium, tin, cobalt and gold.

19. A printed wiring board according to claim 11, wherein the conductor circuit comprises the patterned catalyst film formed on the surface of the insulating layer, the conductor metal deposited on the patterned catalyst film and comprising an electroless plating metal, and a second conductor metal deposited on the conductor metal and comprising an electrolytic plating metal.

20. A printed wiring board according to claim 13, wherein the conductor circuit comprises the patterned catalyst film formed on the surface of the insulating layer, the conductor metal deposited on the patterned catalyst film and comprising an electroless plating metal, and a second conductor metal deposited on the conductor metal and comprising an electrolytic plating metal.

\* \* \* \* \*